US008647796B2

(12) United States Patent
Yu et al.

(10) Patent No.: US 8,647,796 B2
(45) Date of Patent: Feb. 11, 2014

(54) PHOTOACTIVE COMPOUND GRADIENT PHOTORESIST

(75) Inventors: Chen-Hua Yu, Hsin-Chu (TW); Chung-Shi Liu, Hsin-Chu (TW); Hung-Jui Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 195 days.

(21) Appl. No.: 13/192,113

(22) Filed: Jul. 27, 2011

(65) Prior Publication Data
US 2013/0026644 A1    Jan. 31, 2013

(51) Int. Cl.
*G03F 7/00* (2006.01)
(52) U.S. Cl.
USPC .................................. 430/11; 430/9
(58) Field of Classification Search
USPC ....................................... 430/9, 11
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,106,450 A | 4/1992 | Freisitzer et al. | |
| 5,362,585 A * | 11/1994 | Adams ........................... | 430/30 |
| 5,380,681 A | 1/1995 | Hsu | |
| 5,481,133 A | 1/1996 | Hsu | |
| 6,002,177 A | 12/1999 | Gaynes et al. | |
| 6,037,100 A | 3/2000 | Yu et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,834,450 B2 | 11/2010 | Kang | |
| 2002/0132180 A1 | 9/2002 | Koes et al. | |
| 2004/0096779 A1 | 5/2004 | DeSimone | |
| 2010/0323294 A1 | 12/2010 | Li et al. | |

\* cited by examiner

*Primary Examiner* — Kathleen Duda
(74) *Attorney, Agent, or Firm* — Slater & Matsil, L.L.P.

(57) ABSTRACT

A system and method for forming photoresists over semiconductor substrates is provided. An embodiment comprises a photoresist with a concentration gradient. The concentration gradient may be formed by using a series of dry film photoresists, wherein each separate dry film photoresist has a different concentration. The separate dry film photoresists may be formed separately and then placed onto the semiconductor substrate before being patterned. Once patterned, openings through the photoresist may have a tapered sidewall, allowing for a better coverage of the seed layer and a more uniform process to form conductive materials through the photoresist.

20 Claims, 6 Drawing Sheets

PHOTOACTIVE COMPOUND GRADIENT PHOTORESIST

BACKGROUND

Generally, electrical contact can be made to wafers or dies within packages, such as within a package-on-package (POP), by first applying a photoresist over the wafers or dies. The photoresist may then be patterned in order to expose portions of the wafers or dies to which contact is desired to be made. The patterning may be performed by exposing the photoresist to a radiation such as light in order to activate photoactive chemicals that may make up one component of the photoresist. A positive developer or a negative developer may then be used to remove either the exposed photoresist (for a negative development) or to remove the non-exposed photoresist (for a positive development).

Once the photoresist has been developed and patterned, electrical connections to the exposed wafers or dies may be formed by forming conductive material into the patterned photoresist such that an electrical connection is made. The conductive material may be formed by first applying a seed layer over the photoresist and along the sidewalls of the patterned photoresist. The seed layer may then be utilized, for example, in an electroplating process in order to plate the conductive material over and into the patterned photoresist, thereby providing the desired electrical connection to the underlying wafer or die.

However, because seed layers are utilized to form the conductive material, a problem can arise if gaps or other issues regarding the step coverage of the seed layer occurs. These gaps can be especially prevalent along the sidewalls of the photoresist if sputtering is performed to form the seed layer and the photoresist has a vertical sidewall. These gaps could, in turn, could cause gaps, uneven plating, or other problems to occur while the seed layer is used as an initiator for the subsequent plating of the conductive material.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provides many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a gradient photoresist for semiconductor processing. The embodiments may also be applied, however, to other photosensitive compounds.

Figure 1:
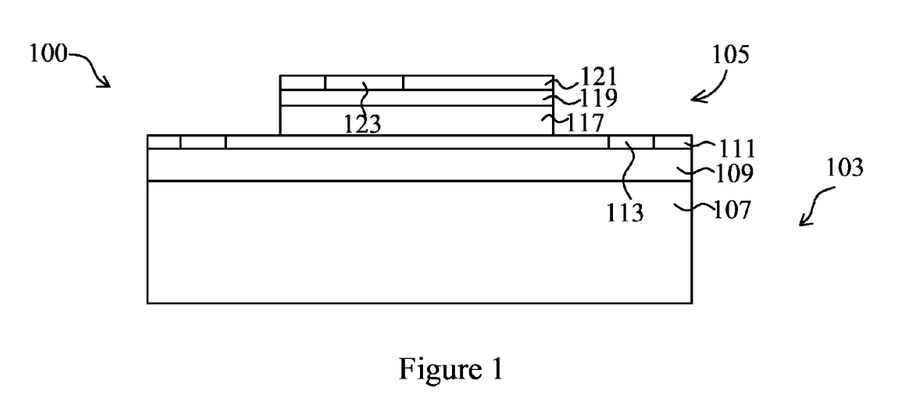
FIG. 1 illustrates a package-on-package with a first wafer and a first die in accordance with an embodiment.

With reference now to FIG. 1, there is shown a package-on-package (POP) system 100 with a first wafer 103 and a first die 105. In an embodiment, the first wafer 103 may be, e.g., a plurality of logic dies (not individually illustrated in FIG. 1) and the first die 105 may be, e.g., a memory die connected to work in conjunction with one of the individual dies on the first wafer 103. However, as one of ordinary skill in the art will recognize, the precise functions of the first wafer 103 and the first die 105 are not limited to these described embodiments, and the first wafer 103 and the first die 105 may alternatively have other configurations such as a memory-on-memory stacked system. This configuration and any other suitable packaging configurations may alternatively be utilized while still remaining within the scope of the embodiments.

The first wafer 103 may comprise a first substrate 107, first active layers 109 on the first substrate 107, a first passivation layer 111, and first contacts 113 through the first passivation layer 111. The first substrate 107 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active layers 109 may comprise active devices and metallization layers (not individually shown in FIG. 1). The active devices may comprise a wide variety of active devices such as capacitors, resistors, inductors and the like in order to generate the desired structural and functional requirements of the design on the first substrate 107. The active devices may be formed using any suitable methods either within or else on the surface of the first substrate 107.

The metallization layers are formed over the first substrate 107 and the active devices and are designed to connect the various active devices to form functional circuitry. While represented together with the active devices in FIG. 1 as a single layer, the metallization layers are formed of alternating layers of dielectric and conductive material and may be formed through any suitable process (such as deposition, damascene, dual damascene, etc.). In an embodiment there may be four layers of metallization separated from the first substrate 107 by at least one interlayer dielectric layer (ILD), but the precise number of metallization layers is dependent upon the design for the first substrate 107.

The first passivation layer 111 may be formed on the first active layers 109 in order to provide protection from physical and environmental harm that exposure may cause. The first passivation layer 111 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 111 may be formed through a process such as chemical vapor deposition (CVD), although any suitable process may be utilized, and may have a thickness between about 0.5 μm and about 5 μm, such as about 9.25 KÅ.

The first contacts 113 may be formed through the first passivation layer 111 in order to provide for electrical contact to the underlying first active layers 109. The first contacts 113 and may be formed of aluminum, although any suitable conductive material may alternatively be utilized. Further, the first contacts 113 may be formed using any suitable process, such as a damascene process, or else may be formed prior to the formation of the first passivation layer 111 through a deposition and masking/etching process. Any suitable method for forming the first contacts 113 may alternatively be utilized.

The first die 105 may comprise a second substrate 117, second active layers 119, a second passivation layer 121, and a second contact 123 formed through the second passivation layer 121. In an embodiment, the second substrate 117 may be similar to the first substrate 107, the second active layers 119 may be similar to the first active layers 109, the second passivation layer 121 may be similar to the first passivation layer 111, and the second contact 123 may be similar to the first contacts 113. However, as one of ordinary skill in the art will recognize, while these structures may be similar to the structures in the first wafer 103, this is not intended to limit the present embodiments, as any other suitable structures may alternatively be formed on the first die 105 while still remaining within the scope of the embodiments. The first die 105 may be connected to the first wafer 103 through, e.g., ball grid arrays (not shown).

Figure 2:
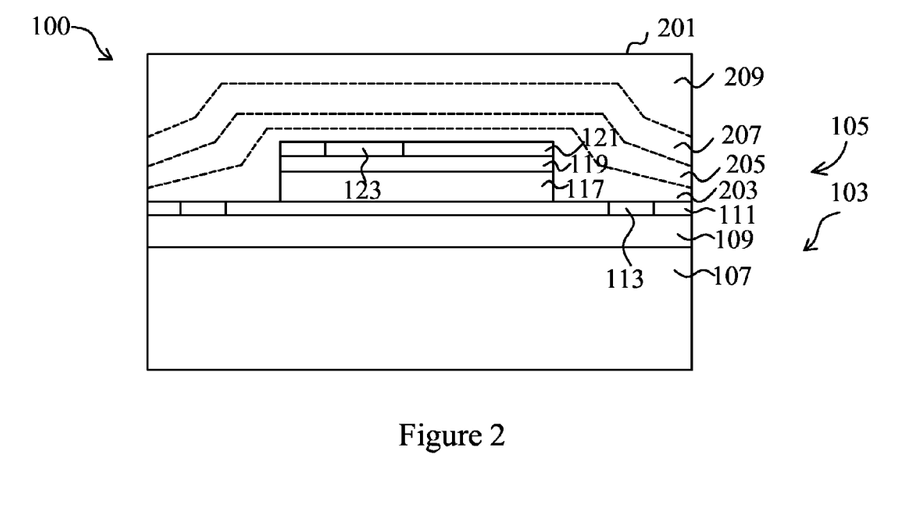
FIG. 2 illustrates a first photoresist formed over the first wafer and the first die in accordance with an embodiment.

FIG. 2 illustrates the formation of a first photoresist 201 over the first wafer 103 and the first die 105. The first photoresist 201 may comprise a mixture of photoactive compounds (PACs) and a polymeric resin dissolved into a solvent. The solvent may comprise any suitable solvent such as, e.g., n-methylpyrrolidone (NMP), a glycol ether such as 2-methoxyethyl ether (diglyme), ethylene glycol monom-ethyl ether, propylene glycol monomethyl ether; lactates such as ethyl lactate or methyl lactate; proponiates such as methyl proponiate, ethyl proponiate and ethyl ethoxy proponiate; or a ketone such as methylethyl ketone, cyclohexanone and 2-heptanone, suitable combinations of these, and the like.

The PACs may be photoactive components such as photo-acid generators, photobase generators, or free-radical generator, or the like, and the PACs may be positive-acting or negative-acting. In an embodiment in which the PACs are a photoacid generator, the PAC may comprise halogenated triazines, onium slats, sulfonated esters, halogenerated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, suitable combinations of these, and the like.

In an embodiment in which the PACs are a free-radical generator, the PACs may comprise n-phenylglycine, aromatic ketones such as benzophenone, N,N-tetramethyl-4,4'-diaminobenzophenone [Michler's ketone], N,N'-tetraethyl-4,4'-diaminobenzophenone, 4-methoxy-4'-dimethylaminobenzophenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzomethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)—5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, alpha aminoketones, oxime-urethane containing molecules such as dibenzophenoneoxime hexamethylene diurethan, ammonium tetraorganylborate salts, and N-(2-nitrobenzyloxycarbonyl)cyclic amines, suitable combinations of these, or the like. However, as one of ordinary skill in the art will recognize, the chemical compounds listed herein are merely intended as illustrated examples of the PACs and are not intended to limit the present embodiments to only those PACs specifically described. Any suitable PAC may alternatively be utilized, and all such PACs are fully intended to be included within the scope of the present embodiments.

The polymeric resin may comprise, for example, polymerized units that may include one or more ethylenically or acetylenically unsaturated monomers. Such monomers may include, but are not limited to, polynorbornenes, (meth) acrylic acid, (meth)acrylamides, alkyl (meth)acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, suitable combinations of these, and the like. Additionally, the polymeric resin may comprise homopolymers or copolymers.

The first photoresist 201 may also comprise other materials that may aid in the placement, exposure, development, and removal of the first photoresist 201. Such materials may include surfactants, actinic and contrast dyes, cross-linking agents, anti-striation agents, plasticizers, speed enhancers, sensitizers, combinations of these, and the like. These and any other additive are fully intended to be included within the scope of the embodiments.

In an embodiment the PACs within the first photoresist 201 may have a concentration gradient. This concentration gradient may have a high concentration of PACs adjacent to the first wafer 103 and have a reduced concentration at a point removed from the first wafer 103. In other words the concentration of PACs in the first photoresist 201 may get smaller as the first photoresist 201 extends away from the first wafer 103.

To achieve this concentration gradient of PACs, the first photoresist 201 may be a dry film photoresist and may comprise a plurality of individual dry film photoresist layers, such as a first dry film photoresist layer 203, a second dry film photoresist layer 205, a third dry film photoresist layer 207, and a fourth dry film photoresist layer 209. In an embodiment, the first dry film photoresist layer 203, the second dry film photoresist layer 205, the third dry film photoresist layer 207, and the fourth dry film photoresist layer 209 may each have a different concentration of PACs such that the percentage of PACs in the first photoresist 201 has a gradient and decreases from the first dry film photoresist layer 203 to the fourth dry film photoresist layer 209 in a step pattern.

In a specific embodiment, the first dry film photoresist layer 203 may have a concentration of PACs (in the solvent along with the resin and other additives) sufficient to reach the desired target critical dimension. For example, in an embodiment in which the target critical dimension is 100 μm, the concentration of PACs may be, e.g., between about 70% and about 100%, such as about 85%. This concentration in the first dry film photoresist layer 203 to reach the target dimension may be viewed as having a concentration of 100% PACs in that there is a full concentration of PACs to reach the target critical dimension.

The second dry film photoresist layer 205 may have a reduced percentage of PACs such that the concentration of PACs in the second dry film photoresist layer 205 may be about 10% lower than the concentration of PACs in the first dry film photoresist 203, or a concentration of about 90% PACs (relative to the 100% concentration in the first dry film photoresist 203). The concentration gradient may continue by having the third dry film photoresist layer 207 have a percentage of PACs (relative to the concentration in the first dry film photoresist 203) of about 80% and the fourth dry film photoresist layer 209 have a percentage of PACs (relative to the concentration in the first dry film photoresist 203) of about 70%. However, the precise numbers presented here are presented as being illustrative only, and are not intended to limit the present embodiments in any fashion. Any suitable concentration gradient of PACs may be utilized within the first photoresist 201 while still remaining within the scope of the embodiments.

The concentration gradient may be formed in the first photoresist 201 by forming the first dry film photoresist layer 203, the second dry film photoresist layer 205, the third dry film photoresist layer 207, and the fourth dry film photoresist layer 209 as separate individual layers prior to their placement over the first wafer 103 and the first die 105. Each of these separate individual layers may be formed with a separate, individual concentration of PACs, such as the 90% concentration of PACs for the second dry film photoresist layer 205 and the 80% concentration of PACs for the third dry film photoresist layer 207. Once the individual layers have been separately formed, the first dry film photoresist layer 203, the second dry film photoresist layer 205, the third dry film photoresist layer 207, and the fourth dry film photoresist layer 209 may each be sequentially placed onto the first wafer 103 and the first die 105 through a process such a laminating or cold rolling.

Figure 3:
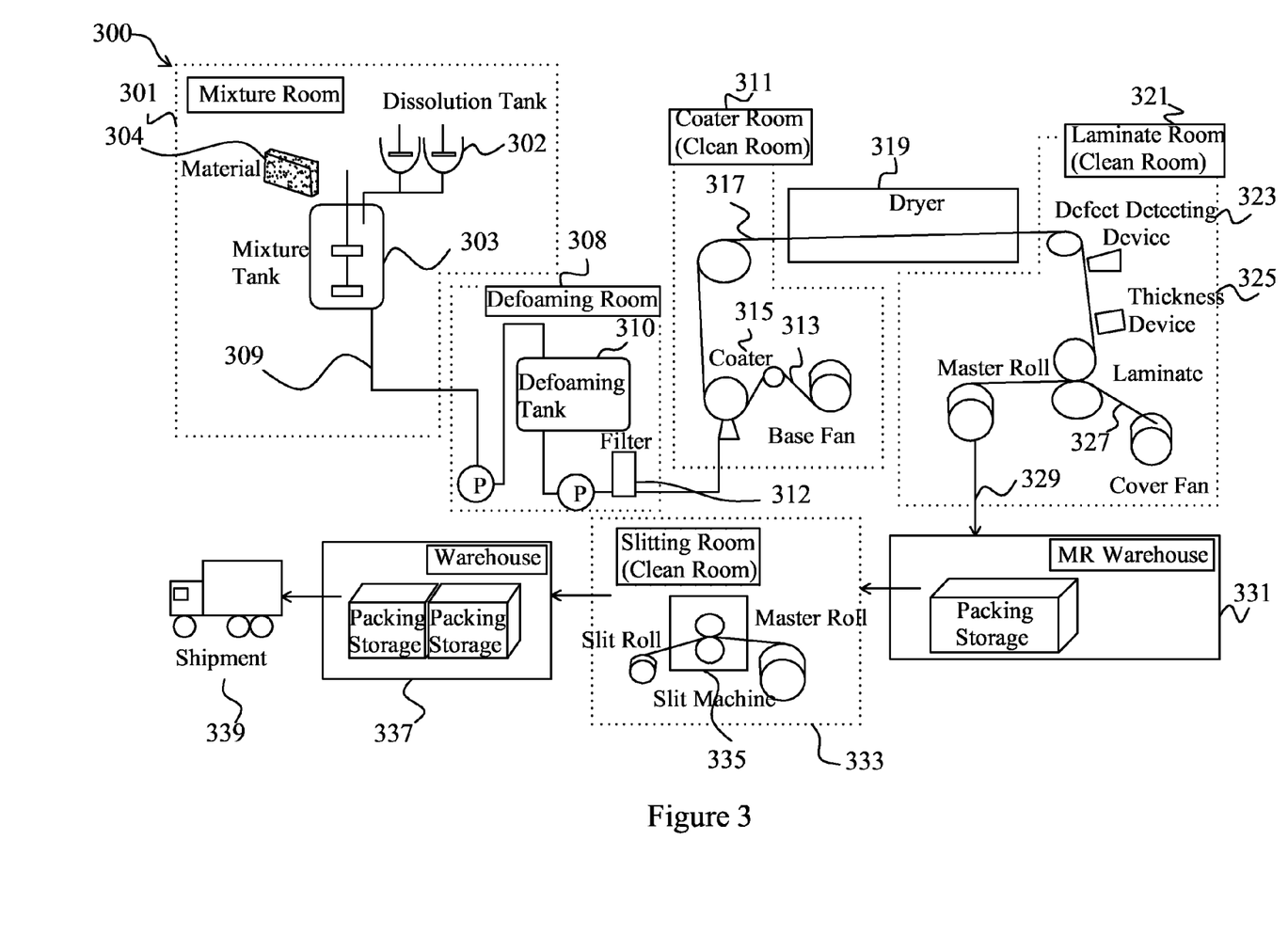
FIG. 3 illustrates a method of forming a dry film resist in accordance with an embodiment.

FIG. 3 illustrates a dry film system 300 and process by which the first dry film photoresist layer 203, the second dry film photoresist layer 205, the third dry film photoresist layer 207, and the fourth dry film photoresist layer 209, may be formed. Looking first generally at the dry film system 300, raw materials 305 for the first dry film photoresist layer 203, the second dry film photoresist layer 205, the third dry film photoresist layer 207, and the fourth dry film photoresist layer 209 may enter the dry film system 300 in a mixture room 301 and either used or stored in dissolution tanks 302. The raw materials 304 may comprise, e.g., the polymeric resin, the PACs, the solvent, etc., described above with respect to FIG. 2. The mixture room 301 may receive the raw materials 305 for a photoactive mixture and mix the raw materials 305 in, e.g., a mixing tank 303 in order to achieve a mixture 309 with a consistent composition of the desired components (described in detail for each of the individual layers below).

Once the appropriate mixture 309 for a dry film photoresist (e.g., the second dry film photoresist layer 205) has been reached, the mixture 309 may be passed through to a deforming room 308 and through a deforming tank 310 and a filter 312 before entering a coater room 311. The coater room 311 may apply the mixture 309 to a base film 313 in order to provide support and maneuverability to the mixture 309. The base film 313 may be, for example, a polyester film derived from polyethylene terephthalate, although any other suitable material for the base film 313 may alternatively be utilized. The base film 313 may be, e.g., 16 μm, 19 μm, or 25 μm, although these numbers are meant to be exemplary only, and any suitable thickness may alternatively be utilized.

In the coater room 311 the mixture 309 may be applied to the base film 313 using, e.g., a coating machine 315. The coating machine 315 may be, e.g., a reverse roll coater, gravure coater, rod coater, air doctor coater, or other suitable coating machine, and may apply the mixture 309 to the base film 313 to form a coated base film 317. The coated base film 317 may then exit the coater room 311 and enter a dryer 319, where the coated base film 317 may be dried at a temperature of between about 80° C. and about 110° C., such as about 100° C., for a time of between about 1 hr and about 2 hr, such as about 1.5 hr.

Once dried, the coated base film 317 may pass to a laminate room 321, where it may pass a defect detecting device 323 and a thickness device 325 for quality control purposes. Once the coated base film 317 is determined to be acceptable, the coated base film 317 may be laminated with a cover film 327 to form a finished dry film resist 329. The cover film 327 may be, e.g., a polyester cover film with a thickness of between about 15 mm and about 40 mm, such as about 20 mm. However, any suitable material and thickness for the cover film 327 may alternatively be utilized.

The finished dry film resist 329 may be stored in a first warehouse 331, sent to a slitting room 333 where the finished dry film resist 329 may be cut to a desired shape and size using, e.g., a slit machine 335. Once the finished dry film resist 329 has been shaped, it may again be stored in a second warehouse 337 until it is ready for shipment 339 and for eventual usage.

While each of the first dry film photoresist layer 203, the second dry film photoresist layer 205, the third dry film photoresist layer 207, and the fourth dry film photoresist layer 209 may be formed using a similar process, the raw materials and their respective concentrations in the mixture 309 may be altered in order to form the first dry film photoresist layer 203, the second dry film photoresist layer 205, the third dry film photoresist layer 207, and the fourth dry film photoresist layer 209. Looking first at the first dry film photoresist layer 203, the first dry film photoresist layer 203 may be manufactured solely from PACs, with no other components such as the polymeric resin or solvents being added to the PACs within the mixture room 301, and only PACs are coated onto the base film 313 and then covered by the cover film 327. Accordingly, the first dry film photoresist layer 203 is 100% PACs.

The second dry film photoresist layer 205 may be formed by adding the polymeric resin, solvent, and other additives at such an amount so that the mixture 309 used to form the second dry film photoresist layer 205 has a concentration of about 90% PACs. Similarly, the third dry film photoresist layer 207 may be formed by adding into the mixture the polymeric resin, solvent, and other additives at such an amount so that the mixture 309 used to form the third dry film photoresist layer 207 has a concentration of about 80% PACs, and the fourth dry film photoresist layer 209 may be formed by adding into the mixture 309 the polymeric resin, solvent, and other additives at such an amount so that the mixture 309 used to form the fourth dry film photoresist layer 209 has a concentration of about 70% PACs. However, while these amounts are listed as an illustrative example, one of ordinary skill in the art will recognize that these are only examples, as any suitable concentrations may be utilized in order to form the desired concentration gradient.

Returning now to FIG. 2, once the first dry film photoresist layer 203, the second dry film photoresist layer 205, the third dry film photoresist layer 207, and the fourth dry film photoresist layer 209 have been formed, each one of the first dry film photoresist layer 203, the second dry film photoresist layer 205, the third dry film photoresist layer 207, and the fourth dry film photoresist layer 209 may be placed over the first wafer 103 and the first die 105. The placement of the first dry film photoresist layer 203, the second dry film photoresist layer 205, the third dry film photoresist layer 207, and the fourth dry film photoresist layer 209 may be performed sequentially by, e.g., laminating the first dry film photoresist layer 203, the second dry film photoresist layer 205, the third dry film photoresist layer 207, and the fourth dry film photoresist layer 209 onto the first wafer 103 and the first die 105. However, any suitable method of sequentially placing the first dry film photoresist layer 203, the second dry film photoresist layer 205, the third dry film photoresist layer 207, and the fourth dry film photoresist layer 209 may alternatively be utilized.

Looking at the lamination of the first dry film photoresist layer 203 as an illustrative example, the finished dry film resist 329 with the appropriate concentration of PACs (e.g., 100% PACs for the first dry film resist 329) may be put into a lamination machine (not shown). The lamination machine may sequentially remove the base film from the finished dry film resist 329 in order to expose the mixture 309, and then contact the mixture 309 to the first wafer 103 and the first die 105. Once the mixture 309 has bonded to the first wafer 103 and the first die 105, the lamination machine may then remove the cover film 327, thereby leaving the mixture 309/first dry film photoresist layer 203 on the first wafer 103 and the first die 105. The remaining second dry film photoresist layer 205, the third dry film photoresist layer 207, and the fourth dry film photoresist layer 209 may then similarly be placed onto the first dry film photoresist layer 203 using a similar process.

By sequentially placing the first dry film photoresist layer 203, the second dry film photoresist layer 205, the third dry film photoresist layer 207, and the fourth dry film photoresist layer 209 (with each one having a different concentration of PACs) onto the first wafer 103 and the first die 105, the concentration gradient of PACs may be formed within the first photoresist 201. In the specific embodiment described above, this concentration gradient may begin with a 100% concentration of PACs adjacent to the first wafer 103 (in the first dry film photoresist layer 203) and decreases in step concentrations as each additional layer is laminated onto the first wafer 103 and the first die 105.

Figure 4:
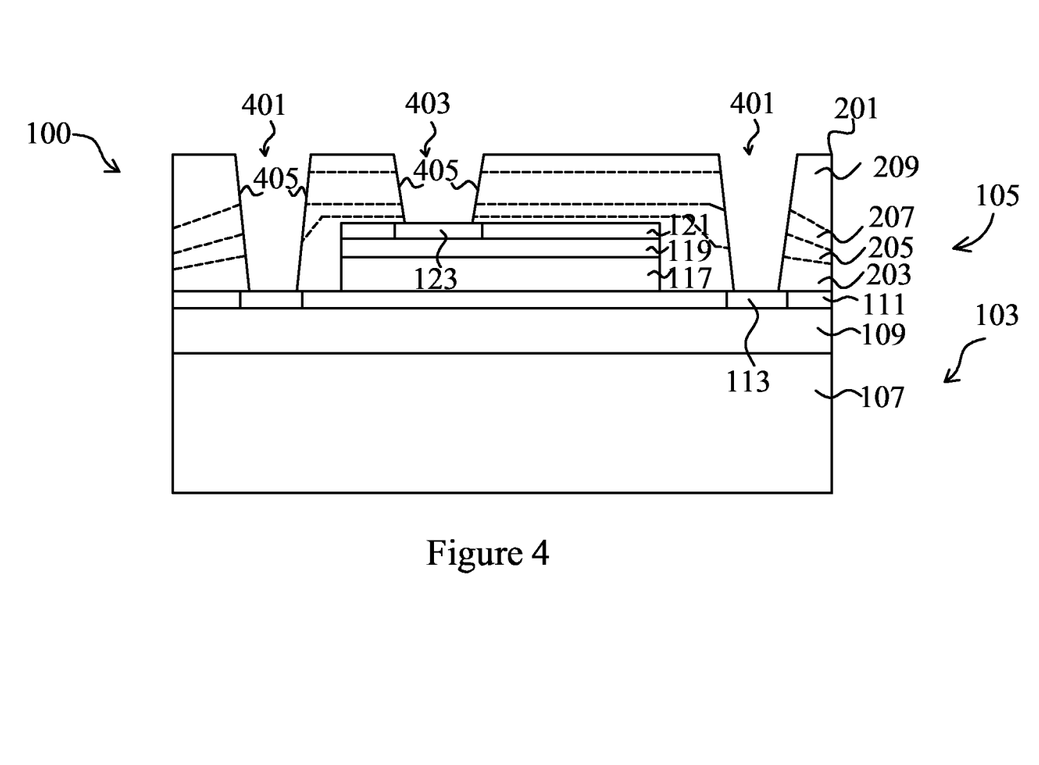
FIG. 4 illustrates a patterning of the first photoresist in accordance with an embodiment.

FIG. 4 illustrates that, once the first photoresist 201 with the concentration gradient has been laminated over the first wafer 103 and the first die 105, the first photoresist 201 may be patterned to form first openings 401 to the first wafer 103 and a second opening 403 to the first die 105. The photoresist 203 may be patterned by exposing the photoresist 203 to a form of radiation, such as light, in order to activate the PACs within those portions of the photoresist 203 that were exposed. The first photoresist 201 may then be exposed to a developer in order to remove either those portions that were exposed (if a positive tone developer is used) or else those portions that were not exposed (if a negative tone developer is used).

However, while photo-resists with a constant concentration of PACs may be utilized to form vertical sidewalls, by having the concentration gradient in the first photoresist 201 as described above with respect to FIG. 2, sidewalls 405 of the first openings 401 and the second opening 403 may be tapered as the development process causes the regions with higher concentrations of PACs to have a weaker coating than the regions with lower concentrations of PACs. In other words, the greater the concentration of PACs, the greater the cross-linking between the polymers in the resin and the larger the opening will become. As such, in the embodiment described above with respect to the target critical dimension being 100 µm, the first dry film photoresist 203 (with 100% PACs) may obtain an opening of about 100 µm, while the second dry film photoresist 205 (with 90% PACs) may obtain an opening of about 110 µm. These tapered sidewalls 405 allow for a more uniform deposition of a subsequently deposited seed layer 501 (discussed below with respect to FIG. 5). This more uniform deposition may reduce or eliminate gaps that may otherwise be formed during the deposition process.

Figure 5:
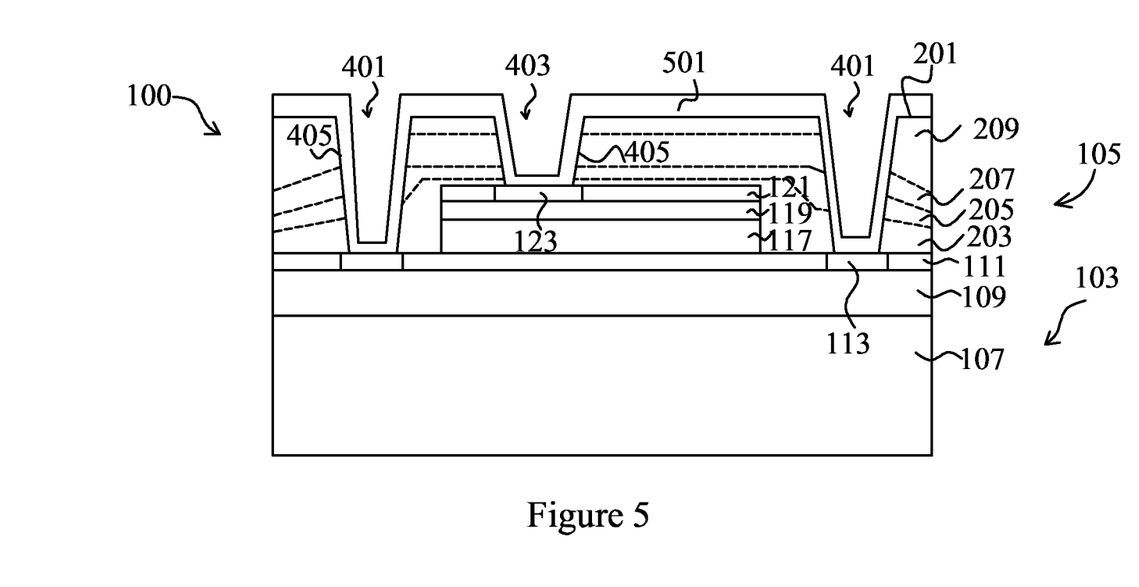
FIG. 5 illustrates a seed layer formed over the first photoresist in accordance with an embodiment.

FIG. 5 illustrates the formation of a seed layer 501 over the first photoresist 201 and along the sidewalls 405 and bottoms of the first openings 401 and the second opening 403. The seed layer 501 may be used as an initiator for the further deposition of material (described below with respect to FIG. 7). The seed layer 501 may be deposited by PVD, CVD, sputtering, or the like, and may be formed of copper, nickel, gold, a titanium copper alloy, combinations of these, or the like, although other methods and materials may alternatively be used if desired. Additionally, the seed layer 501 may have a thickness of between about 50 Å and about 1,000 Å.

Figure 6:
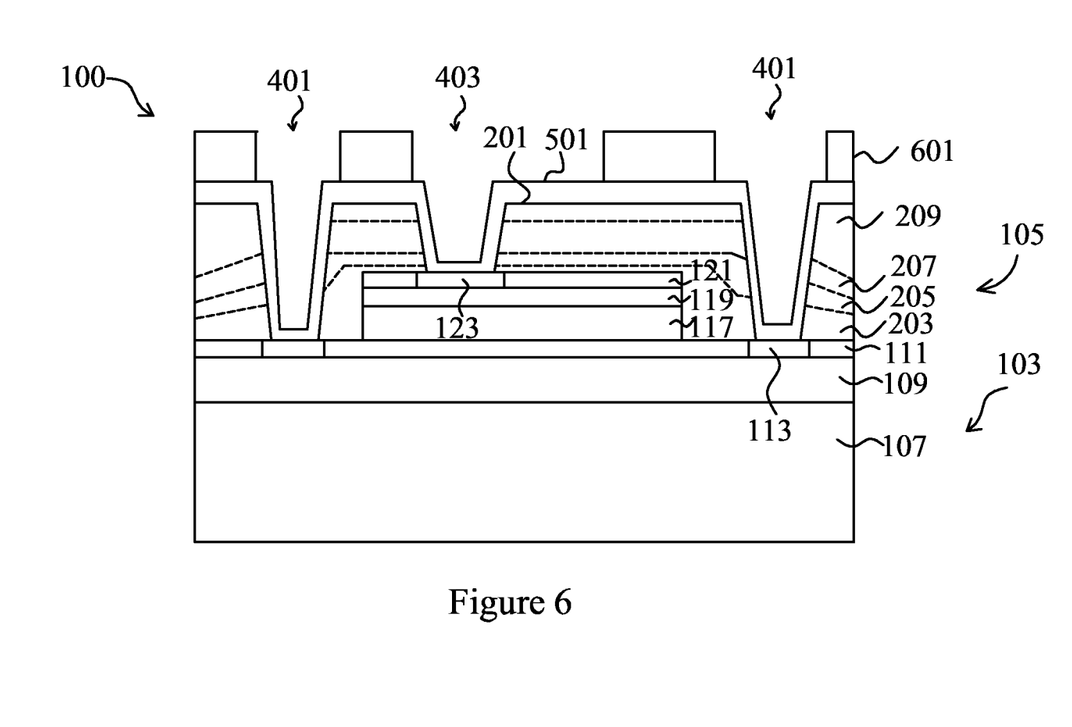
FIG. 6 illustrates a second photoresist formed over the seed layer in accordance with an embodiment.

FIG. 6 illustrates a second photoresist 601 formed over the seed layer 501 once the seed layer 501 has been formed. The second photoresist 601 may be formed of similar materials and in a similar fashion as the first photoresist 201, such as by laminating a series of dry film photoresist layers with different concentrations of PACs onto the seed layer 501 in order to obtain a concentration gradient of PACs within the second photoresist 601. Alternatively, the second photoresist 601 may be a wet or dry photoresist with a constant concentration of PACs throughout the second photoresist 601.

After the second photoresist 601 has been placed over the seed layer 501, the second photoresist 601 may be patterned in order to cover portions of the seed layer 501 where a subsequent plating (described further below with respect to FIG. 7) is not desired. To pattern the second photoresist 601, the second photoresist 601 may be exposed to, e.g., a radiation such as light in a desired pattern in order to activate the PACs within the second photoresist 601. After being exposed, the second photoresist may then be developed using, e.g., a negative-type or positive-type developer in order to expose regions of the seed layer 501 to which plating is desired.

Figure 7:
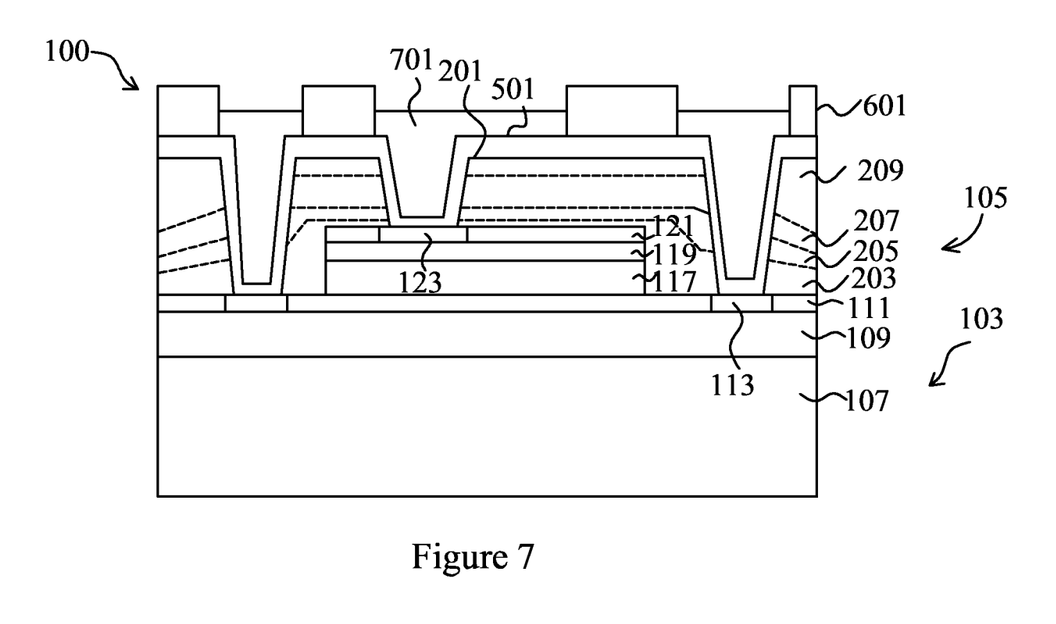
FIG. 7 illustrates a conductive material formed within the first photoresist in accordance with an embodiment.

After the second photoresist 601 has been patterned, conductive material 701 may be formed within the first openings 401 and the second opening 403 in order to provide electrical connection to both the first wafer 103 and the first die 105. The conductive material 701 may comprise copper, although other suitable materials such as aluminum, alloys, doped polysilicon, combinations thereof, and the like, may alternatively be utilized. The conductive material 701 may be formed to a thickness of between about 0.3 µm and about 0.6 µm, such as about 0.5 µm, and may be formed by electroplating copper onto the exposed portions of the seed layer 501 (those portions not covered by the second photoresist 601), although any suitable alternative process for the formation of the conductive material 701 may alternatively be utilized.

By utilizing a photoresist with a concentration gradient of PACs, the sidewalls of subsequently formed openings through the photoresist may be tapered. This tapering may help to prevent gaps and other coverage issues from arising during deposition of a seed layer. Without these issues arising with the seed layer, a subsequently formed conductive material formed using the seed layer as an initiator may be formed with more uniformity and consistency than may be otherwise possible.

In an embodiment a semiconductor device comprising a substrate and a photoresist over the substrate is provided. The photoresist comprises photoactive compounds, the photoactive compounds having a concentration gradient as the photoresist extends away from the substrate.

In another embodiment a semiconductor device comprising a first substrate and a second substrate over the first substrate is provided. A photoresist is over the first substrate and the second substrate, the photoresist having a first concentration of photoactive compounds adjacent to the first substrate and a second concentration of photoactive compounds at a point removed from the first substrate, the second concentration of photoactive compounds being less than the first concentration of photoactive compounds. A first contact extends through the photoresist and in electrical connection with the first substrate, the first contact having a first tapered sidewall, and a second contact extending through the photoresist and in electrical connection with the second substrate, the second contact having a second tapered sidewall.

In another embodiment a method for forming a semiconductor device is provided. The method comprises placing a first photoresist layer over a substrate, the first photoresist layer having a first concentration of photoactive compounds, and placing a second photoresist layer over the first photoresist layer, the second photoresist layer having a second concentration of photoactive compounds, the second concentration of photoactive compounds being different from the first concentration of photoactive compounds. The first photoresist layer and the second photoresist layer are patterned to form a first opening through the first photoresist layer and the second photoresist layer.

Although the embodiments and their advantages have been described in detail, it should be understood that various changes, substitutions and alterations can be made herein without departing from the spirit and scope of the embodiments as defined by the appended claims. For example, the exact photoactive compounds utilized or the precise concentrations used in order to form the concentration gradient may be adjusted while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a substrate; and
   a photoresist over the substrate, the photoresist comprising photoactive compounds, the photoactive compounds having a concentration gradient, wherein the concentration of the photoactive compounds is different at different distances from the substrate.

2. The semiconductor device of claim 1, wherein the substrate further comprises:
   a first semiconductor substrate; and
   a die over the first semiconductor substrate.

3. The semiconductor device of claim 1, wherein the photoresist further comprises:
   a first layer of photoresist with a first concentration of photoactive compounds; and
   a second layer of photoresist with a second concentration of photoactive compounds, the second concentration being less than the first concentration.

4. The semiconductor device of claim 3, wherein the first concentration is a concentration to reach a desired critical dimension.

5. The semiconductor device of claim 3, wherein the photoresist further comprises:
   a third layer of photoresist with a third concentration of photoactive compounds, the third concentration being less than the second concentration; and
   a fourth layer of photoresist with a fourth concentration of photoactive compounds, the fourth concentration being less than the third concentration.

6. The semiconductor device of claim 1, wherein the concentration gradient has a reduction in concentration as the photoresist extends away from the substrate.

7. The semiconductor device of claim 1, further comprising an opening through the photoresist, the opening having a tapered sidewall.

8. The semiconductor device of claim 1, wherein the concentration gradient has a step profile.

9. A semiconductor device comprising:
   a first layer of photoresist over a substrate; and
   a second layer of photoresist over the first layer of photoresist, the first layer of photoresist and the second layer of photoresist having a concentration gradient of photoactive compounds, wherein the first layer of photoresist has a first concentration of photoactive compounds and the second layer of photoresist has a second concentration of photoactive compounds different from the first concentration of photoactive compounds.

10. The semiconductor device of claim 9, wherein the second layer of photoresist has a lower concentration of photoactive compounds than the first layer of photoresist.

11. The semiconductor device of claim 9, wherein the substrate further comprises:
    a first semiconductor substrate; and
    a die over the first semiconductor substrate.

12. The semiconductor device of claim 9, further comprising a third layer of photoresist over the second layer of photoresist, the third layer of photoresist having a lower concentration of photoactive compounds than the second layer of photoresist.

13. The semiconductor device of claim 9, wherein the concentration of photoactive compounds between the first layer of photoresist and the second layer of photoresist has a step profile.

14. The semiconductor device of claim 9, further comprising an opening through the second layer of photoresist, the opening having a tapered sidewall.

15. A semiconductor device comprising:
    a substrate;
    a first layer over the substrate, the first layer comprising a first concentration of photoactive compounds; and
    a second layer over and in physical contact with the first layer, the second layer comprising a second concentration of photoactive compounds, wherein the first concentration and the second concentration are part of a concentration gradient.

16. The semiconductor device of claim 15, wherein the substrate further comprises:
a first semiconductor substrate; and
a die over the first semiconductor substrate.

17. The semiconductor device of claim 15, further comprising a third layer over and in physical contact with the second layer, the third layer having a third concentration of photoactive compounds, the third concentration being less than the second concentration.

18. The semiconductor device of claim 17, further comprising a fourth layer over and in physical contact with the third layer, the fourth layer having a fourth concentration of photoactive compounds, the fourth concentration being less than the third concentration.

19. The semiconductor device of claim 15, further comprising an opening through the second layer, the opening having a tapered sidewall.

20. The semiconductor device of claim 15, wherein the first layer is a dry film photoresist.

* * * * *